US012685077B2

(12) United States Patent
Chiu et al.

(10) Patent No.: US 12,685,077 B2
(45) Date of Patent: Jul. 14, 2026

(54) RETICLE POD HAVING ANTI-COLLISION GAP STRUCTURE

(71) Applicant: GUDENG PRECISION INDUSTRIAL CO., LTD., New Taipei City (TW)

(72) Inventors: Ming-Chien Chiu, New Taipei City (TW); Chia-Ho Chuang, New Taipei City (TW); Yi-Hsuan Lee, New Taipei City (TW); Hsing-Min Wen, New Taipei City (TW); Hsin-Min Hsueh, New Taipei City (TW)

(73) Assignee: GUDENG PRECISION INDUSTRIAL CO., LTD., New Taipei City (TW)

( * ) Notice: Subject to any disclaimer, the term of this patent is extended or adjusted under 35 U.S.C. 154(b) by 168 days.

(21) Appl. No.: 17/338,804

(22) Filed: Jun. 4, 2021

(65) Prior Publication Data

US 2022/0102178 A1     Mar. 31, 2022

Related U.S. Application Data

(60) Provisional application No. 63/085,221, filed on Sep. 30, 2020.

(51) Int. Cl.
| | |
|---|---|
| *H10P 72/10* | (2026.01) |
| *G03F 7/00* | (2006.01) |
| *G08C 17/02* | (2006.01) |
| *H05K 5/00* | (2006.01) |
| *H05K 5/02* | (2006.01) |

(52) U.S. Cl.
CPC ...... *H10P 72/1906* (2026.01); *G03F 7/70741* (2013.01); *G08C 17/02* (2013.01); *H05K 5/0034* (2013.01); *H05K 5/0208* (2013.01); *H10P 72/1912* (2026.01); *H10P 72/1921* (2026.01); *H10P 72/1928* (2026.01)

(58) Field of Classification Search
CPC ......... H01L 21/67369; H01L 21/67359; G03F 7/70741; G03F 1/66; H10P 72/1906; H10P 72/1912; H10P 72/1921; H10P 72/1928
USPC ......................... 206/455, 454, 456, 710, 712
See application file for complete search history.

(56) References Cited

U.S. PATENT DOCUMENTS

| | | | | |
|---|---|---|---|---|
| 3,661,253 | A | * | 5/1972 | Cronkhite .......... B65D 73/0035 229/406 |
| 3,719,273 | A | * | 3/1973 | Abe ..................... B65D 75/323 206/509 |
| 4,924,258 | A | * | 5/1990 | Tsutsui ................ G03F 7/70716 269/21 |
| 5,740,845 | A | * | 4/1998 | Bonora ............. H01L 21/67373 414/217 |

(Continued)

*Primary Examiner* — Rafael A Ortiz
*Assistant Examiner* — Jenine Spicer
(74) *Attorney, Agent, or Firm* — Troutman Pepper Locke LLP; Tim Tingkang Xia, Esq.

(57) ABSTRACT

The invention discloses a reticle pod for receiving a reticle. The reticle pod includes a base and plural support device provided on the base for supporting the reticle. A first distance is defined between a peripheral area of a bottom surface of the reticle and an upward facing top surface of the base. A second distance is defined between a central area of the bottom surface of the base and the upward facing top surface of the base, wherein the central area is encircled by the peripheral area. The second distance is larger than the first distance.

7 Claims, 3 Drawing Sheets

(56)                    References Cited

U.S. PATENT DOCUMENTS

| | | | | |
|---|---|---|---|---|
| 5,743,409 | A * | 4/1998 | Nakahara | H01L 21/67386 |
| | | | | 206/719 |
| 5,999,397 | A * | 12/1999 | Chen | G03F 7/70741 |
| | | | | 361/270 |
| 6,196,391 | B1 * | 3/2001 | Li | G03F 7/70741 |
| | | | | 206/719 |
| 6,216,873 | B1 * | 4/2001 | Fosnight | G03F 7/70741 |
| | | | | 206/454 |
| 6,338,409 | B1 * | 1/2002 | Neary | H01L 21/67353 |
| | | | | 206/454 |
| 9,691,668 | B2 * | 6/2017 | Chang | C23C 16/4585 |
| 9,958,772 | B1 * | 5/2018 | Hsueh | H01L 21/67366 |
| 2002/0089656 | A1 * | 7/2002 | Guo | G03F 7/70741 |
| | | | | 435/5 |
| 2002/0130061 | A1 * | 9/2002 | Hengst | H01L 21/67303 |
| | | | | 211/41.18 |
| 2003/0213716 | A1 * | 11/2003 | Cleaver | H01L 21/67346 |
| | | | | 206/454 |
| 2006/0120840 | A1 * | 6/2006 | Chiu | H01L 21/67353 |
| | | | | 414/416.01 |
| 2006/0260978 | A1 * | 11/2006 | Gregerson | H01L 21/67376 |
| | | | | 206/710 |
| 2008/0173560 | A1 * | 7/2008 | Umeda | H01L 21/67353 |
| | | | | 209/558 |
| 2012/0018347 | A1 * | 1/2012 | Ku | H01L 21/67353 |
| | | | | 206/710 |
| 2012/0028440 | A1 * | 2/2012 | Castex | H01L 21/2007 |
| | | | | 438/459 |
| 2017/0294326 | A1 * | 10/2017 | Raschke | H01L 21/67011 |
| 2020/0117079 | A1 * | 4/2020 | Wang | G03F 1/66 |

* cited by examiner

RETICLE POD HAVING ANTI-COLLISION GAP STRUCTURE

FIELD OF THE INVENTION

The present disclosure relates to a reticle pod capable of preventing a reticle therein from hitting or scratching the base of the reticle pod and capable of protecting the reticle.

DESCRIPTION OF THE PRIOR ART

During a conventional EUV (Extreme Ultraviolet) process, a reticle being transported and stored must be protected with a reticle pod, as particles resulting from collision or friction affect the cleanness of the reticle to the detriment of the quality of end products.

To protect the reticle against contamination, the reticle pod must firmly fix the reticle in place to prevent the reticle from rubbing against or moving within the reticle pod. To this end, the contact area between the reticle and reticle pod must be minimized to prevent the reticle from coming into contact with or rubbing against fixing elements or supporting elements in the reticle pod. Furthermore, an appropriate distance between the reticle and reticle pod must be maintained to preclude contact between the reticle and reticle pod and thereby protect the reticle.

Therefore, it is imperative to provide a reticle pod with an appropriate distance between the base of the reticle pod and a reticle received in the reticle pod to prevent the reticle from being damaged or contaminated in the course of the interaction (for example, lifting or laying the reticle with a robotic arm) between the reticle and the base.

SUMMARY OF THE INVENTION

It is an objective of the present disclosure to provide a reticle pod capable of preventing a reticle received therein from hitting or scratching the base of the reticle pod and capable of protecting the reticle.

In order to achieve the above and other objectives, the present disclosure provides a reticle pod comprising: a base; and a plurality of support devices disposed on the base to support the reticle, with a first distance defined between a peripheral area of a bottom surface of the reticle and an upward-facing top surface of the base, and a second distance defined between a central area of a bottom surface of the base and the upward-facing top surface of the base, wherein the central area is encircled by the peripheral area, and the second distance is greater than the first distance.

Preferably, the base has a support surface encircling the upward-facing top surface, and the support surface is an annular plane.

Preferably, the first distance ranges from 0.18 mm to 0.30 mm.

Preferably, the second distance is greater than 1.50 mm.

Preferably, the upward-facing top surface of the base faces the reticle and has planarity of less than 0.06 mm.

Preferably, the first distance is the shortest distance between the peripheral area of the bottom surface of the reticle and the upward-facing top surface of the base, and the second distance is the shortest distance between the central area of the bottom surface of the reticle and the upward-facing top surface of the base.

Preferably, the central area of the bottom surface of the reticle at least includes a pattern area of the reticle.

Preferably, the upward-facing top surface of the base has a deflection surface.

Preferably, the peripheral area has an outer edge and an inner edge and extends therebetween, and a distance less than 5 mm is defined between the outer edge and the inner edge.

BRIEF DESCRIPTION OF THE DRAWINGS

The present disclosure is depicted by drawings, illustrated by non-restrictive, non-exhaustive embodiments, and described below. The drawings are not drawn to scale but are aimed at disclosing the structural features and principles of the present disclosure.

DETAILED DESCRIPTION OF THE EMBODIMENTS

The present disclosure is depicted by accompanying drawings, illustrated by specific embodiment and described below. However, the subject matter claimed by the present disclosure can be implemented in various ways; hence, the subject matter falling within the scope of or claimed by the present disclosure is not restricted to any specific embodiments of the present disclosure. The specific embodiments of the present disclosure serve illustrative purposes only. Likewise, the present disclosure is aimed at defining reasonably broad scope of the subject matter falling within the scope of or claimed by the present disclosure. Furthermore, for example, the subject matter claimed by the present disclosure can be implemented by a method, devices or system. Therefore, the specific embodiments can be provided, for example, in the form of hardware, software, firmware or any combinations (not existing software) thereof.

The expression "an embodiment" used herein does not necessarily refer to the same specific embodiment. Furthermore, the expression "other (a few/some) embodiments" used herein does not necessarily refer to different specific embodiments. The expressions are aimed at, for example, enabling the claimed subject matter to include the combination of all or part of the specific embodiments.

Figure 1:
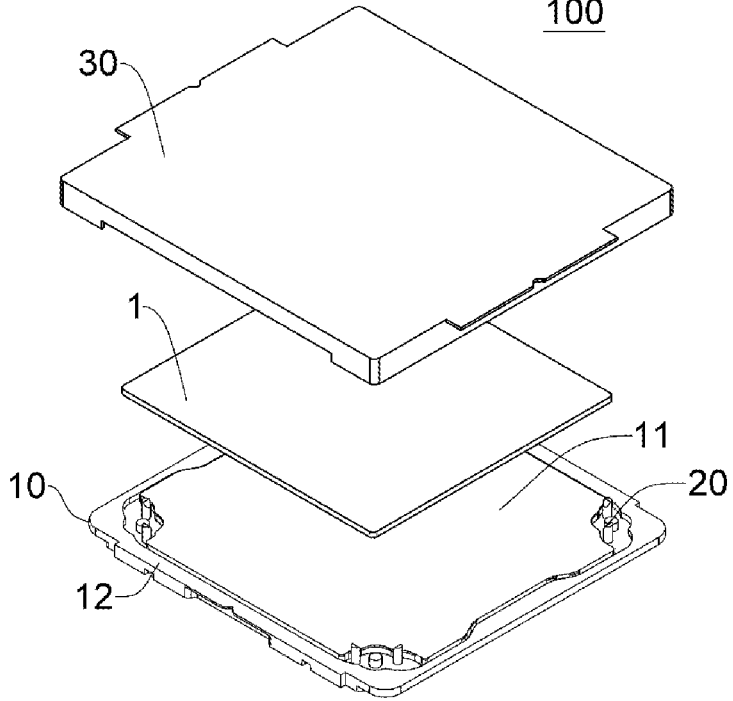
FIG. 1 is an exploded view of a reticle pod of the present disclosure.

Referring to FIG. 1, there is shown an exploded view of a reticle pod of the present disclosure. The diagram shows an inner pod of an EUV reticle pod but not an outer pod thereof. A reticle pod 100 of the present disclosure receives a reticle 1. The reticle pod 100 comprises a base 10 and a plurality of support devices 20 disposed on the base 10. The support devices 20 each have a support pin 21 and two positioning elements 22. The support pins 21 support the reticle 1. The positioning elements 22 supportingly confine the reticle 1 to the base 10.

Figure 3:
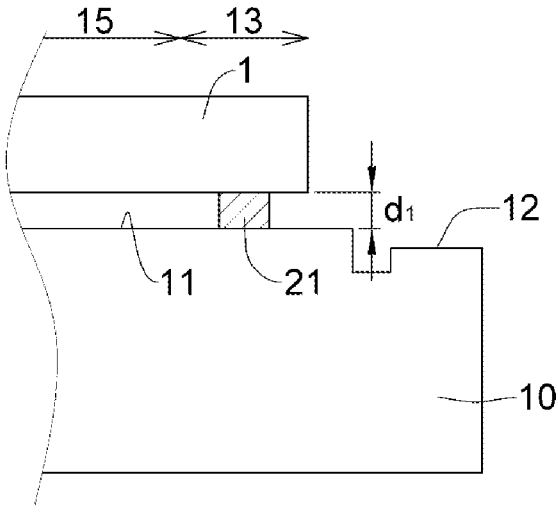
FIG. 3 is a partial, lateral cross-sectional view of the reticle pod of the present disclosure.

In an embodiment, the support height of the support devices 20 is selected in such a way as to allow a first distance d1 to be defined between the bottom surface of the reticle 1 and an upward-facing top surface 11 of the base 10 (shown in FIG. 3). However, as a result of mechanical processing, the upward-facing top surface 11 of the base 10 is disadvantaged by deflection, and in consequence a second distance d2 (shown in FIG. 4) greater than the first distance d1 is defined between the base 10 and the bottom surface of the reticle 1 and corresponds in position to a central area 15 encircled by a peripheral area 13 defined on the reticle 1. The first distance d1 and the second distance d2 are the shortest distances between the top surface 11 of the base 10 and the peripheral area 13 of the reticle 1 and between the top surface 11 of the base 10 and the area (central area 15 of the reticle 1) encircled by the peripheral area 13, respectively.

The reticle pod 100 of the present disclosure further comprises a cover 30. The cover 30 is coupled to the base 10 and adapted to cover the reticle 1. A receiving space is formed between the base 10 and the cover 30 in contact therewith and adapted to receive the reticle 1. An additional means of hermetic sealing can be applied to the reticle pod 100 to insulate the receiving space from its external fluid environment, thereby preventing gas exchange between the receiving space and its external fluid environment. Therefore, the reticle pod 100 of the present disclosure protects the reticle 1 against contamination and collision-induced damage. Although the relationship between the reticle 1 and the base 10 is herein described in detail, the cover 30 is not.

Figure 2:
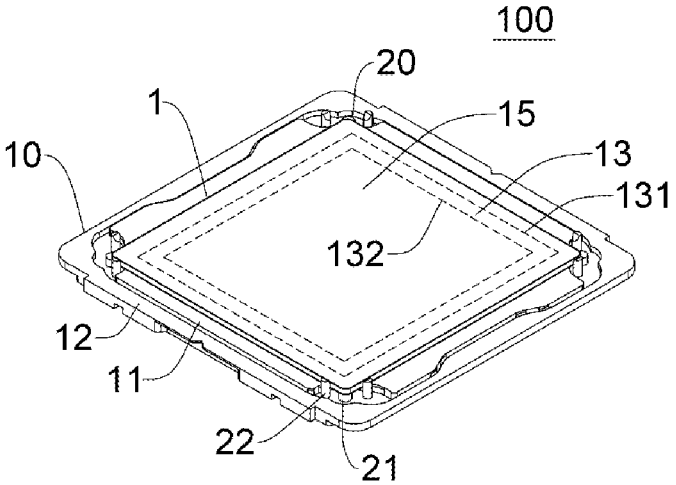
FIG. 2 is a perspective view, showing a reticle disposed on a base of the reticle pod of the present disclosure.

Referring to FIG. 2, there is shown a perspective view, showing a reticle disposed on a base of the reticle pod of the present disclosure. Referring to FIG. 3, there is shown a lateral cross-sectional view of the reticle pod of the present disclosure. The base 10 of the reticle pod 100 of the present disclosure has an upward-facing top surface 11 (hereinafter referred to as the top surface 11) and at least a support surface 12 encircling the top surface 11. The support surface 12 is an annular plane in contact with a downward-facing annular surface (not shown) of the cover 30. A groove is formed between the support surface 12 and the top surface 11. The support devices 20 are disposed between the top surface 11 and the support surface 12 and arranged to surround the top surface 11. In this embodiment, regarding each support device 20, the support pin 21 is disposed between the two positioning elements 22. The four corners of the reticle 1 are positioned in place by the positioning elements 22. The support pin 21 allows the reticle 1 to lie flatly on the base 10. The first distance d1 is defined between the bottom surface of the reticle 1 and the top surface 11 of the base 10. The support height of the support devices 20 is selected in such a way that the vertical distance between a part of the bottom surface of the reticle 1 (the part of the bottom surface of the reticle 1 is near the support devices 20) and the top surface 11 of the base 10 is as great as the first distance d1. Referring to FIG. 2, an area of the reticle 1 corresponds in position to the first distance d1 and is substantially a peripheral area 13 at the encircling periphery of the reticle 1. In this embodiment, the first distance d1 defined between the bottom surface of the reticle 1 (the bottom surface corresponds in position to the peripheral area 13) and the top surface 11 of the base 10 ranges from 0.18 mm to 0.30 mm. The peripheral area 13 extends from the edge of the reticle 1 to the central area of the reticle 1 and is substantially near the support devices 20; however, the peripheral area 13 is not necessarily in the shape of a rectangular ring. In an embodiment, the distance between an outer edge 131 and an inner edge 132 of the peripheral area 13 is less than 5 mm.

Figure 4:
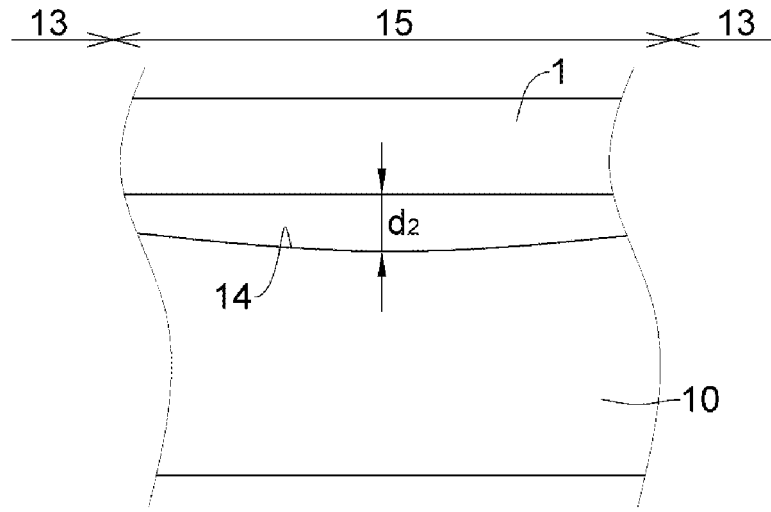
FIG. 4 is a schematic view of the reticle pod whose base surface undergoes deflection according to the present disclosure.

Referring to FIG. 4, there is shown a schematic view of the reticle pod whose base surface undergoes deflection because of mechanical processing according to the present disclosure. In general, the top surface 11 of the base 10 is visually flat as shown in FIG. 2. In practice, the top surface 11 of the base 10 undergoes deflection because of low frequency during a processing process. Therefore, the top surface 11 of the base 10 is a downward-facing concave surface 14 as shown in FIG. 3. The vertical distance (second distance d2) between the central area 15 of the bottom surface of the reticle 1 and the top surface 11 of the base 10 is slightly greater than the vertical distance (first distance d1) between the peripheral area 13 of the bottom surface of the reticle 1 and the top surface 11 of the base 10. The second distance d2 defined between the reticle 1 and the top surface 11 of the base 10 is formed between the central area 15 of the bottom surface of the reticle 1 and the downward-facing concave surface 14 of the base 10. An area of the reticle 1 corresponds in position to the second distance d2 and is encircled by the peripheral area 13. In an embodiment, the height of the support devices 20 is selected in such a way that the second distance d2 is greater than 1.50 mm, i.e., greater than the first distance d1; hence, the reticle 1 is well-protected while being lifted off or laid on the base 10 with a robotic arm, because the base 10 is unlikely to hit or scratch the reticle 1 in the presence of the first distance d1 and second distance d2 between the reticle 1 and the base 10.

The peripheral area 13 corresponding in position to the first distance d1 does not necessarily adjoin the central area 15 corresponding in position to the second distance d2. In other words, the central area 15 corresponding in position to the second distance d2 may be smaller than all the area encircled by the peripheral area 13. For example, the central area 15 corresponding in position to the second distance d2 may at least include a pattern area on the reticle 1.

In a preferred embodiment, the top surface (such as the upward-facing top surface 11 shown in FIG. 3 or the downward-facing concave surface 14 shown in FIG. 4) of the base 10 faces the bottom surface of the reticle 1 and has planarity of less than 0.06 mm. The planarity of a workpiece is a measure of deviation of an actual plane of a surface of the workpiece from an ideal plane (for example, perfect plane), as disclosed in Taiwan patent application 110101422. When the reticle 1 is in contact with the base 10 to attain the aforesaid relationship between the first distance d1 and second distance d2, the planarity of the upward-facing top surface 11 of the base 10 is less than 0.06 mm to thereby lower the chance of a collision between the reticle 1 and the base 10.

The reticle pod of the present disclosure has advantages described below. The second distance defined between the central area of the reticle and the base is greater than the first distance defined between the bottom surface of the peripheral area of the reticle and the base to thereby lower the chance that the reticle will be hit or scratched in the course of interaction between the reticle and the base, so as to protect the reticle. Owing to the first distance and second distance, the process of lifting the reticle off the base is unlikely to trigger severe turbulence which might otherwise cause attachment of particles to the bottom surface of the reticle, so as to protect the pattern area of the reticle against contamination.

The measurement of the aforesaid vertical distance between the bottom surface of the reticle 1 and the top surface 11 of the base 10 can be achieved by a known means. For instance, the measurement of the first distance d1 entails determining the scope of the peripheral area 13 of the reticle 1, then determining measurement points on an area of the top surface 11, wherein the area of the top surface 11 corresponds in position to the peripheral area 13, determining the vertical distance between each measurement point and the bottom surface of the reticle 1 by a known means, and finally setting the first distance d1 between the peripheral area 13 of the reticle 1 and the top surface 11 of the base 10 to the shortest one of the vertical distances thus determined. Likewise, the measurement of the second distance d2 entails determining a central area 15 encircled by the peripheral area 13 of the reticle 1 (for example, an area which at least includes the pattern of the reticle), then determining (say, 35) measurement points on an area of the top surface 11, wherein the area of the top surface 11 corresponds in position to the central area 15, determining the vertical distance between each measurement point and the bottom surface of the reticle 1 by a known means, and finally setting the second distance d2 between the central area 15 of the reticle 1 and the top surface 11 of the base 10 to the shortest one of the vertical distances thus determined.

Although the present disclosure is described above in detail, specific changes and amendments may be made to the claims of the present disclosure. The aforesaid embodiments serve illustrative purposes only but are not restrictive of the present disclosure; hence, the aforesaid embodiments may be amended without departing from the scope of the appended claims or the equivalent scope thereof.

What is claimed is:

1. A reticle pod for receiving a reticle, the reticle pod comprising:
   a base, having a support surface and an upward-facing top surface surrounded by the support surface, the support surface extending around the base; and
   a plurality of support devices disposed on the base to support the reticle when the reticle is received in the reticle pod, with a first distance defined between a peripheral area of a bottom surface of the reticle and the upward-facing top surface of the base, and a second distance defined between a central area of a bottom surface of the reticle and the upward-facing top surface of the base, wherein the central area is surrounded by the peripheral area, and the second distance is greater than the first distance;
   wherein each of the support devices has a support pin and two positioning elements, and a corner of the reticle is positioned in place by the two positioning elements;
   wherein the upward-facing top surface of the base faces the reticle and has planarity of less than 0.06 mm.

2. The reticle pod of claim 1, wherein the first distance ranges from 0.18 mm to 0.30 mm.

3. The reticle pod of claim 1, wherein the second distance is greater than 1.50 mm.

4. The reticle pod of claim 1, wherein when the reticle is received in the reticle pod, the first distance is the shortest distance between the peripheral area of the bottom surface of the reticle and the upward-facing top surface of the base, and the second distance is the shortest distance between the central area of the bottom surface of the reticle and the upward-facing top surface of the base.

5. The reticle pod of claim 1, wherein when the reticle is received in the reticle pod the central area of the bottom surface of the reticle at least includes a pattern area of the reticle.

6. The reticle pod of claim 1, wherein the upward-facing top surface of the base has a deflection surface caused by a low frequency factor from mechanical processing.

7. The reticle pod of claim 1, wherein the peripheral area has an outer edge and an inner edge and extends therebetween, and a distance less than 5 mm is defined between the outer edge and the inner edge.

* * * * *